United States Patent
Yaginuma et al.

(10) Patent No.: US 9,318,402 B2
(45) Date of Patent: Apr. 19, 2016

(54) RESIN COMPOSITION, PREPREG AND RESIN SHEET AND METAL FOIL-CLAD LAMINATE

(75) Inventors: Michio Yaginuma, Tokyo (JP); Shoichi Ito, Tokyo (JP); Yoshitaka Ueno, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 152 days.

(21) Appl. No.: 14/005,920

(22) PCT Filed: Mar. 22, 2012

(86) PCT No.: PCT/JP2012/057308
§ 371 (c)(1),
(2), (4) Date: Nov. 25, 2013

(87) PCT Pub. No.: WO2012/128313
PCT Pub. Date: Sep. 27, 2012

(65) Prior Publication Data
US 2014/0073721 A1 Mar. 13, 2014

(30) Foreign Application Priority Data
Mar. 24, 2011 (JP) .................................. 2011-065943

(51) Int. Cl.
| | |
|---|---|
| *B32B 15/08* | (2006.01) |
| *B32B 15/082* | (2006.01) |
| *B32B 15/092* | (2006.01) |
| *B32B 27/04* | (2006.01) |
| *B32B 27/18* | (2006.01) |
| *B32B 27/30* | (2006.01) |
| *B32B 27/38* | (2006.01) |
| *C08L 63/00* | (2006.01) |
| *C08L 71/12* | (2006.01) |
| *C08J 5/24* | (2006.01) |
| *H01L 23/29* | (2006.01) |
| *H05K 1/03* | (2006.01) |
| *C08G 59/40* | (2006.01) |
| *B32B 15/14* | (2006.01) |
| *C08L 71/02* | (2006.01) |
| *C08G 73/00* | (2006.01) |
| *H05K 3/02* | (2006.01) |

(52) U.S. Cl.
CPC .............. *H01L 23/295* (2013.01); *B32B 15/08* (2013.01); *B32B 15/14* (2013.01); *C08G 59/4014* (2013.01); *C08G 73/00* (2013.01); *C08J 5/24* (2013.01); *C08L 63/00* (2013.01); *C08L 71/02* (2013.01); *H05K 1/0373* (2013.01); *B32B 2260/021* (2013.01); *B32B 2260/046* (2013.01); *B32B 2305/076* (2013.01); *B32B 2457/08* (2013.01); *C08J 2363/00* (2013.01); *C08J 2371/02* (2013.01); *C08J 2375/04* (2013.01); *H01L 2924/0002* (2013.01); *H05K 3/022* (2013.01); *H05K 2201/012* (2013.01)

(58) Field of Classification Search
None
See application file for complete search history.

(56) References Cited

U.S. PATENT DOCUMENTS

| | | | |
|---|---|---|---|
| 2008/0300350 A1* | 12/2008 | Ohno et al. ................... | 524/147 |
| 2009/0203279 A1 | 8/2009 | Mori et al. | |
| 2010/0218982 A1 | 9/2010 | Fujiwara et al. | |
| 2011/0054087 A1* | 3/2011 | Chopdekar et al. ........... | 524/110 |
| 2011/0244183 A1 | 10/2011 | Goto et al. | |
| 2015/0017449 A1* | 1/2015 | Itoh et al. ...................... | 428/416 |

FOREIGN PATENT DOCUMENTS

| | | | | |
|---|---|---|---|---|
| CN | 101508844 | 8/2009 | | |
| JP | 57-145127 | 9/1982 | | |
| JP | 10-273518 | 10/1998 | | |
| JP | 10-292122 | 11/1998 | | |
| JP | 11-035795 | 2/1999 | | |
| JP | 2000248169 A | * | 9/2000 | .............. C08L 71/12 |
| JP | 2002-194212 | 7/2002 | | |
| JP | 2002-194235 | 7/2002 | | |
| JP | 2003-221430 | 8/2003 | | |
| JP | 2005-105099 | 4/2005 | | |
| JP | 2005-120173 | 5/2005 | | |
| JP | 2006-193607 | 7/2006 | | |
| JP | 2008-088079 | 4/2008 | | |
| JP | 2009-073996 | 4/2009 | | |
| JP | 2010059363 A | * | 3/2010 | .............. C08G 59/32 |
| WO | 2009/041137 | 4/2009 | | |
| WO | 2010/035452 | 4/2010 | | |

OTHER PUBLICATIONS

Machine translation of JP 2000248169 A, provided by the JPO website (no date).*
Machine translation of JP 2010059363 A, provided by the JPO website (no date).*
International Search Report issued May 22, 2012 in PCT/2012/057308.

* cited by examiner

*Primary Examiner* — Michael J Feely
(74) *Attorney, Agent, or Firm* — Greenblum & Bernstein, P.L.C.

(57) ABSTRACT

A resin composition is provided which can be suitably used in a printed circuit board having excellent electrical properties, heat resistance and peel strength, with flame retardancy maintained, a prepreg and resin sheet which use the same, and a metal foil-clad laminate which uses the prepreg. A resin composition including a polyphenylene ether (A), a specific phosphorus-containing cyanate ester compound (B), a non-halogenated epoxy resin (C), a cyanate ester compound (D) and a filler (E) is used.

17 Claims, No Drawings

RESIN COMPOSITION, PREPREG AND RESIN SHEET AND METAL FOIL-CLAD LAMINATE

TECHNICAL FIELD

The present invention relates to a resin composition and, more particularly, to a resin composition which can be suitably used in a printed circuit board having excellent electrical properties, heat resistance and peel strength, with flame retardancy maintained. Furthermore, the present invention relates to a prepreg and a resin sheet which are prepared using the resin composition, and a metal foil-clad laminate which uses the prepreg.

BACKGROUND ART

In recent years, information terminal equipment including a personal computer and a server, and communication equipment such as an internet router and optical communication are required to process a large volume of information at high speeds, and thus increases in speed and frequency of an electrical signal are in progress. With this, a printed circuit board material used therein is required to achieve lower dielectric constant and lower dielectric loss tangent besides properties such as flame retardancy, heat resistance and peel strength against a copper foil or the like, which have been conventionally required, thus leading to various attempts for the constitution of the resin composition in order to meet these property requirements.

In order to impart electrical properties to these materials, there is known a recipe in which a resin having a low-dielectric constant and a low dielectric loss tangent such as a fluorine resin, a cyanate ester resin, a polyphenylene ether resin, and a vinyl compound mainly comprising styrene is contained in a resin composition (see, for example, Patent Literature 1). Generally, a laminate using such compounds, which is inferior in flame retardancy, requires to contain a halogenated compound in a resin composition in order to impart flame retardancy (see, for example, Patent Literatures 2 and 3). However, the use of halogenated compounds causes an environmental problem that toxic substances such as dioxin may occur at the time of incineration.

Hence, for example, an addition of a compound mainly comprising phosphorus and nitrogen has been examined as an approach for achieving flame retardancy without containing any halogenated compound (see, for example, Patent Literatures 4 and 5). However, nitrogen compounds may produce harmful nitrogen oxide, and also phosphorus compounds which have been conventionally used cause a problem that heat resistance is deteriorated, namely, the glass transition temperature (Tg) of the resin composition is decreased as an addition amount is increased to achieve flame retardancy (see, for example, Patent Literatures 6 and 7).

CITATION LIST

Patent Literature

Patent Literature 1: Japanese Patent Laid-Open No. 2002-194212
Patent Literature 2: Japanese Patent Laid-Open No. 10-273518
Patent Literature 3: Japanese Patent Laid-Open No. 2005-120173
Patent Literature 4: Japanese Patent Laid-Open No. 11-035795
Patent Literature 5: Japanese Patent Laid-Open No. 2002-194235
Patent Literature 6: Japanese Patent Laid-Open No. 10-292122
Patent Literature 7: Japanese Patent Laid-Open No. 2003-221430

SUMMARY OF INVENTION

Technical Problem

An object of the present invention is to provide a resin composition which is capable of satisfying flame retardancy, heat resistance and peel strength against a copper foil of a printed circuit board material obtained from a non-halogenated compound alone as a component of a resin composition, and which further imparts excellent electrical properties, a prepreg and a resin sheet which use the same, and a metal foil-clad laminate which uses the prepreg.

Solution to Problem

As a result of keen study, the present inventors have found that the aforementioned problem could be solved by using a resin composition comprising a polyphenylene ether (A), a specific phosphorus-containing cyanate ester compound (B), a non-halogenated epoxy resin (C), a cyanate ester compound (D) and a filler (E), and completed the present invention.

That is, the inventions of 1 to 19 listed below are provided.

1. A resin composition comprising a polyphenylene ether (A); a phosphorous-containing cyanate ester compound (B) represented by general formula (1)

[Formula 1]

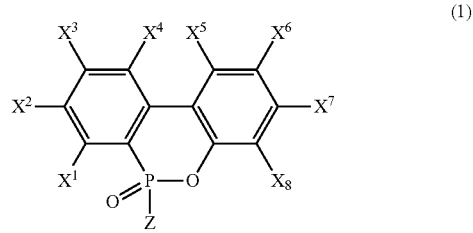

wherein $X^1$ to $X^8$ represent a hydrogen atom, an alkyl group, a cycloalkyl group, an aryl group, or an aralkyl group, which may be the same or different from each other, and Z represents a group represented by general formula (2):

[Formula 2]

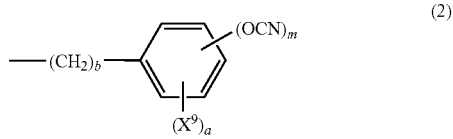

wherein $X^9$ represents a hydrogen atom, an alkyl group, a cycloalkyl group, an aryl group, or an aralkyl group, which may be the same or different from each other, and
a represents an integer of 1 to 4, b represents an integer of 0 to 4, and m represents an integer of 1 to 4, or a group represented by general formula (3):

[Formula 3]

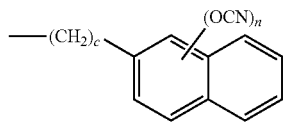
(3)

wherein c represents an integer of 0 to 4, and n represents an integer of 1 to 3; a non-halogenated epoxy resin (C); a cyanate ester compound (D) other than the compound represented by the formula (1); and a filler (E).

2. The resin composition according to 1, wherein the polyphenylene ether (A) is a polymer comprising at least a repeating unit represented by general formula (4):

[Formula 4]

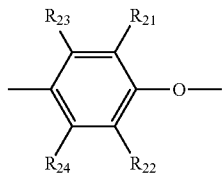
(4)

wherein $R_{21}$, $R_{22}$, $R_{23}$, and $R_{24}$ may be the same or different from each other, and represent an alkyl group having 6 or less carbon atoms, an aryl group, halogen, or hydrogen.

3. The resin composition according to 2, wherein the polymer further comprises a repeating unit represented by general formula (5):

[Formula 5]

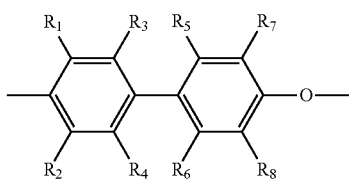
(5)

wherein $R_1$, $R_2$, $R_3$, $R_7$, and $R_8$ may be the same or different from each other, and are an alkyl group having 6 or less carbon atoms or a phenyl group, and $R_4$, $R_5$, and $R_6$ may be the same or different from each other, and are a hydrogen atom, an alkyl group having 6 or less carbon atoms or a phenyl group, and/or a repeating unit represented by general formula (6):

[Formula 6]

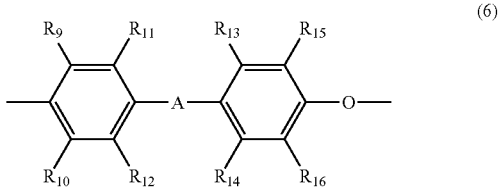
(6)

wherein $R_9$, $R_{10}$, $R_{11}$, $R_{12}$, $R_{13}$, $R_{14}$, $R_{15}$, and $R_{16}$ may be the same or different from each other, and are a hydrogen atom, an alkyl group having 6 or less carbon atoms or a phenyl group, and -A- is a linear, branched, or cyclic divalent hydrocarbon group having 20 or less carbon atoms.

4. The resin composition according to any of 1 to 3, wherein the polyphenylene ether (A) comprises a modified polyphenylene ether having an ethylenically unsaturated group at both ends.

5. The resin composition according to 4, wherein the ethylenically unsaturated group is at least one selected from the group consisting of an alkenyl group, a cycloalkenyl group, and an alkenyl aryl group.

6. The resin composition according to any of 1 to 5, wherein the polyphenylene ether (A) comprises a modified polyphenylene ether represented by general formula (7):

[Formula 7]

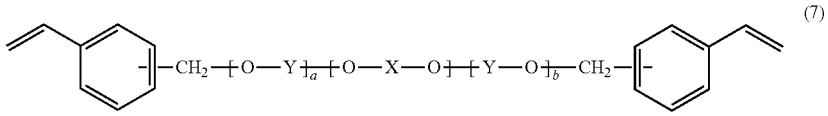
(7)

wherein —(O—X—O)— comprises a structure represented by general formula (8):

[Formula 8]

$$\pm O - X - O \pm = \begin{bmatrix} R_1 & R_3 & R_5 & R_7 \\ -O & & & O- \\ R_2 & R_4 & R_6 & R_8 \end{bmatrix}$$
(8)

wherein $R_1$, $R_2$, $R_3$, $R_7$, and $R_8$ may be the same or different from each other, and are an alkyl group having 6 or less carbon atoms or a phenyl group, and $R_4$, $R_5$, and $R_6$ may be the same or different from each other, and are a hydrogen atom, an alkyl group having 6 or less carbon atoms or a phenyl group, or general formula (9):

[Formula 9]

(9)

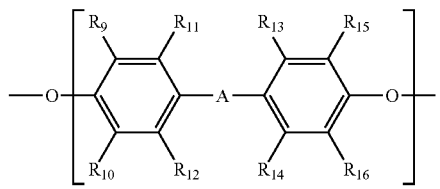

wherein $R_9$, $R_{10}$, $R_{11}$, $R_{12}$, $R_{13}$, $R_{14}$, $R_{15}$, and $R_{16}$ may be the same or different from each other, and are a hydrogen atom, an alkyl group having 6 or less carbon atoms or a phenyl group, and -A- is a linear, branched, or cyclic divalent hydrocarbon group having 20 or less carbon atoms; and —(Y—O)— is represented by general formula (10):

[Formula 10]

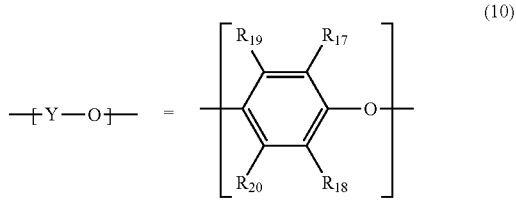
(10)

wherein $R_{17}$ and $R_{18}$ may be the same or different from each other, and are an alkyl group having 6 or less carbon atoms or a phenyl group, and $R_{19}$ and $R_{20}$ may be the same or different from each other, and are a hydrogen atom, an alkyl group having 6 or less carbon atoms or a phenyl group, and a sequence of the —(Y—O)— units comprises one —(Y—O)— unit or two or more different —(Y—O)— units arranged randomly, and a and b represent an integer of 0 to 100, with at least either of a and b being not 0.

7. The resin composition according to any of 1 to 6, wherein a number average molecular weight of the polyphenylene ether (A) is 500 to 3000.

8. The resin composition according to any of 1 to 7, wherein the phosphorus-containing cyanate ester compound (B) is a compound wherein, in formula (1), $X^1$ to $X^8$ are a hydrogen atom or a methyl group, which may be the same or different from each other, Z represents a group represented by formula (2), $X^9$ is a hydrogen atom, an alkyl group, or an aryl group, a is 1 to 4, b is 0 to 2, and m is 1 to 2.

9. The resin composition according to any of 1 to 8, wherein the phosphorus-containing cyanate ester compound (B) is a compound represented by formula (11):

[Formula 11]

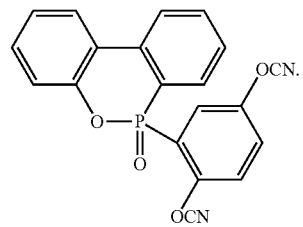
(11)

10. The resin composition according to any of 1 to 9, wherein a content of the polyphenylene ether (A) is 50 to 90 parts by mass with respect to 100 parts by mass of a total of the (A) to (D) components.

11. The resin composition according to any of 1 to 10, wherein a content of the phosphorus-containing cyanate ester compound (B) is 10 to 25 parts by mass with respect to 100 parts by mass of a total of the (A) to (D) components.

12. The resin composition according to any of 1 to 11, wherein the non-halogenated epoxy resin (C) is at least one selected from the group consisting of a naphthalene modified epoxy resin, a biphenyl aralkyl-based epoxy resin, and a cresol novolac-based epoxy resin.

13. The resin composition according to any of 1 to 12, wherein a content of the non-halogenated epoxy resin (C) is 1 to 15 parts by mass with respect to 100 parts by mass of a total of the (A) to (D) components.

14. The resin composition according to any of 1 to 13, wherein the cyanate ester compound (D) is a bisphenol A-based cyanate ester resin or a naphthol aralkyl-based cyanate ester resin.

15. The resin composition according to any of 1 to 14, wherein a content of the cyanate ester compound (D) is 1 to 15 parts by mass with respect to 100 parts by mass of a total of the (A) to (D) components.

16. The resin composition according to any of 1 to 15, wherein a content of the filler (E) is 10 to 200 parts by mass with respect to 100 parts by mass of a total of the (A) to (D) components.

17. A prepreg obtained by impregnating or coating a base material with the resin composition according to any of 1 to 16.

18. A metal foil-clad laminate obtained by stacking at least one prepreg according to 17, disposing a metal foil on one surface or both surfaces of the prepreg or the stacked prepregs, and lamination-molding the metal foil and the prepreg or the stacked prepregs.

19. A resin sheet obtained by coating the surface of a metal foil or a film with a solution of the resin composition according to any of 1 to 16, and drying the solution.

Advantageous Effects of Invention

The resin composition, the prepreg and the resin sheet which use the same, and the metal foil-clad laminate which uses the prepreg according to the present invention do not produce any toxic substances at the time of incineration, excel in flame retardancy, heat resistance and peel strength against a copper foil, have further excellent electrical properties, and thus are suitable for printed circuit board materials, thereby providing extremely high industrial applicability.

DESCRIPTION OF EMBODIMENTS

Hereinafter, the embodiments of the present invention will be described. Note that the following embodiments are to be considered as an illustrative example to explain the present invention, and that the present invention is not limited only to the embodiments.

Resin Composition

The resin composition according to the present invention comprises a polyphenylene ether (A), a specific phosphorus-containing cyanate ester compound (B), a non-halogenated epoxy resin (C), a cyanate ester compound (D) and a filler (E). The resin composition may further comprise a silane coupling agent and other components such as a hardening accelerator. The resin composition according to the present invention is preferably used to prepare a prepreg for a printed circuit board. Hereinafter, each component constituting the resin composition will be described.

Polyphenylene Ether (A)

The polyphenylene ether (A) used in the present invention is preferably a polymer comprising at least a repeating unit represented by general formula (4):

[Formula 12]

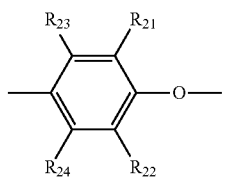

(4)

wherein $R_{21}$, $R_{22}$, $R_{23}$ and $R_{24}$ may be the same or different from each other, and represent an alkyl group having 6 or less carbon atoms, an aryl group, halogen, or hydrogen. The polymer may further contain a repeating unit represented by general formula (5):

[Formula 13]

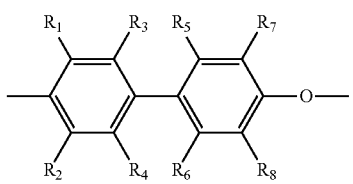

(5)

wherein $R_1$, $R_2$, $R_3$, $R_7$ and $R_8$ may be the same or different from each other, and are an alkyl group having 6 or less carbon atoms or a phenyl group, and $R_4$, $R_5$ and $R_6$ may be the same or different from each other, and are a hydrogen atom, an alkyl group having 6 or less carbon atoms or a phenyl group and/or a repeating unit represented by general formula (6):

[Formula 14]

(6)

wherein $R_9$, $R_{10}$, $R_{11}$, $R_{12}$, $R_{13}$, $R_{14}$, $R_{15}$ and $R_{16}$ may be the same or different from each other, and are a hydrogen atom, an alkyl group having 6 or less carbon atoms or a phenyl group, and -A- is a linear, branched, or cyclic divalent hydrocarbon group having 20 or less carbon atoms.

In the present invention, as the polyphenylene ether (A), in part or all, a modified polyphenylene ether functionalized by an ethylenically unsaturated group such as a vinylbenzyl group, an epoxy group, an amino group, a hydroxyl group, a mercapto group, a carboxyl group, a silyl group, and the like can be used. These may be used singly or in combination of two or more kinds thereof.

A method for producing the modified polyphenylene ether is not particularly limited, as far as the advantageous effects of the present invention are obtained. For example, a modified polyphenylene ether functionalized by a vinylbenzyl group can be produced by dissolving a bifunctional phenylene ether oligomer and vinylbenzyl chloride in a solvent, adding a base to cause reaction under heating and stirring, and then solidifying the resin. A modified polyphenylene ether functionalized by a carboxyl group is produced by melt kneading an unsaturated carboxylic acid or a functional derivative thereof in polyphenylene ether to cause reaction, for example, in the presence or absence of a radical initiator. Alternatively, a modified polyphenylene ether can be produced by dissolving polyphenylene ether and an unsaturated carboxylic acid or a functional derivative thereof in an organic solvent in the presence or absence of a radical initiator to cause reaction as a solution.

It is preferred that the polyphenylene ether (A) in the present invention comprises a modified polyphenylene ether having an ethylenically unsaturated group at both terminals. Examples of the ethylenically unsaturated group include an alkenyl group such as an ethenyl group, an allyl group, a methallyl group, a propenyl group, a butenyl group, a hexenyl group and an octenyl group, a cycloalkenyl group such as a cyclopentenyl group and a cyclohexenyl group, and an alkenylaryl group such as a vinylbenzyl group and a vinylnaphthyl group, and the vinylbenzyl group is preferable. Two ethylenically unsaturated groups at both ends may be the same functional group, or may be different functional groups.

It is particularly preferred that the polyphenylene ether (A) in the present invention comprises a modified polyphenylene ether represented by general formula (7):

[Formula 15]

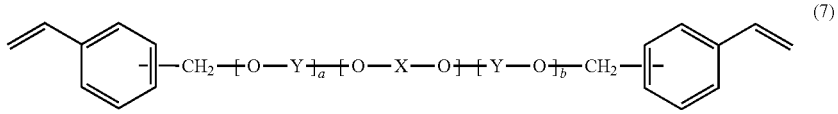

(7)

wherein —(O—X—O)— comprises a structure represented by general formula (8):

[Formula 16]

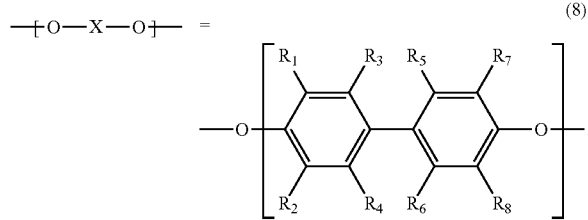

wherein $R_1$, $R_2$, $R_3$, $R_7$, and $R_8$ may be the same or different from each other, and are an alkyl group having 6 or less carbon atoms or a phenyl group, and $R_4$, $R_5$, and $R_6$ may be the same or different from each other, and are a hydrogen atom, an alkyl group having 6 or less carbon atoms or a phenyl group, or general formula (9):

[Formula 17]

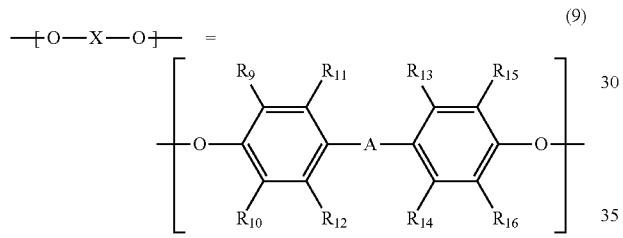

wherein $R_9$, $R_{10}$, $R_{11}$, $R_{12}$, $R_{13}$, $R_{14}$, $R_{15}$, and $R_{16}$ may be the same or different from each other, and are a hydrogen atom, an alkyl group having 6 or less carbon atoms or a phenyl group, and -A- is a linear, branched, or cyclic divalent hydrocarbon group having 20 or less carbon atoms, and —(Y—O)— is represented by general formula (10):

[Formula 18]

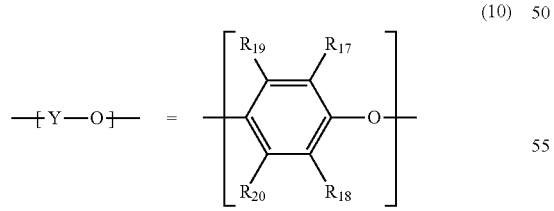

wherein $R_{17}$ and $R_{18}$ may be the same or different from each other, and are an alkyl group having 6 or less carbon atoms or a phenyl group, and $R_{19}$ and $R_{20}$ may be the same or different from each other, and are a hydrogen atom, an alkyl group having 6 or less carbon atoms or a phenyl group, and a sequence of the —(Y—O)— units comprises one —(Y—O)— unit or two or more different-(Y—O)— units arranged randomly, and a and b represent an integer of 0 to 100, with at least either of a and b being not 0.

Examples of -A- in the general formula (7) include a divalent organic group such as methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene, 1-phenylethylidene, but not limited thereto.

Among the polyphenylene ethers (A) of the present invention, a polyphenylene ether in which $R_1$, $R_2$, $R_3$, $R_7$, $R_8$, $R_{17}$, and $R_{18}$ are an alkyl group having 3 or less carbon atoms, and $R_4$, $R_5$, $R_6$, $R_9$, $R_{10}$, $R_{11}$, $R_{12}$, $R_{13}$, $R_{14}$, $R_{15}$, $R_{16}$, $R_{19}$, and $R_{20}$ are a hydrogen atom or an alkyl group having 3 or less carbon atoms is preferable. Particularly, a polyphenylene ether having a structure in which —(O—X—O)— represented by the general formula (8) or the general formula (9) is the formula (12), the general formula (13), or the general formula (14), and —(Y—O)— represented by the general formula (10) is the formula (15) or the formula (16), or —(Y—O)— represented by the general formula (10) is a structure in which the formula (15) and the formula (16) are arranged randomly is more preferable.

[Formula 19]

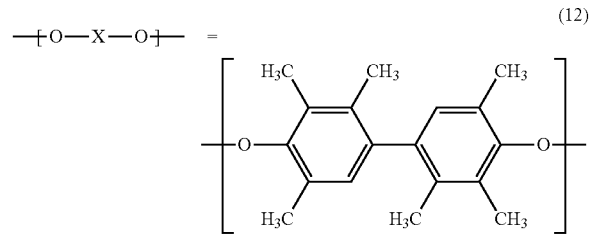

[Formula 20]

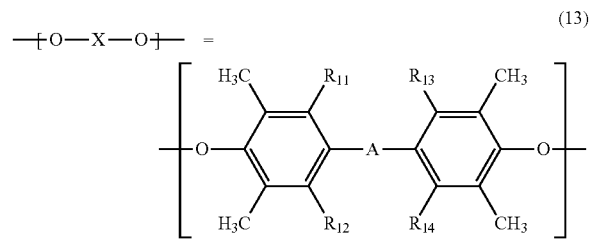

(wherein $R_{11}$ $R_{12}$, $R_{13}$, and $R_{14}$ may be the same or different from each other, and are a hydrogen atom or a methyl group, and -A- is a linear, branched, or cyclic divalent hydrocarbon group having 20 or less carbon atoms.)

[Formula 21]

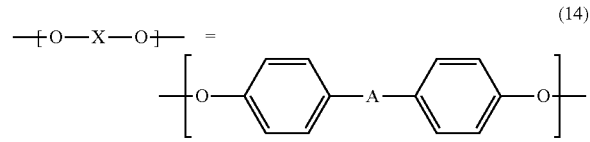

(wherein -A- is a linear, branched, or cyclic divalent hydrocarbon group having 20 or less carbon atoms.)

[Formula 22]

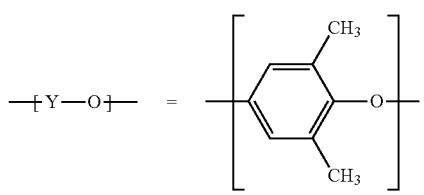
(15)

[Formula 23]

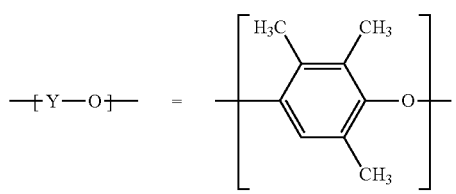
(16)

A method for producing a modified polyphenylene ether having a structure represented by the formula (7) is not particularly limited, and the modified polyphenylene ether can be produced, for example, by converting a terminal phenolic hydroxyl group of a bifunctional phenylene ether oligomer, which is obtainable by subjecting a bifunctional phenol compound and a monofunctional phenol compound to oxidative coupling, into a vinylbenzyl ether.

The number average molecular weight of the polyphenylene ether (A) is preferably in the range of 500 to 3000, and is more preferably in the range of 1000 to 2500 in terms of polystyrene by a GPC method. If the number average molecular weight is 500 or more, a polyphenylene ether is not susceptible to becoming sticky when made into a film form. Further, if the number average molecular weight is 3000 or less, a reduction in solubility in a solvent can be prevented.

The content of the polyphenylene ether (A) is preferably in the range of 50 to 90 parts by mass, more preferably in the range of 60 to 80 parts by mass, and particularly preferably in the range of 65 to 75 parts by mass with respect to 100 parts by mass of a total of (A) to (D) components from the viewpoint of electrical properties, flame retardancy, and peel strength.

Phosphorus-Containing Cyanate Ester Compound (B)

The phosphorus-containing cyanate ester compound (B) used in the present invention is represented by the general formula (1):

[Formula 24]

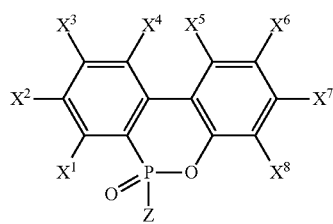
(1)

wherein $X^1$ to $X^8$ represent a hydrogen atom, an alkyl group, a cycloalkyl group, an aryl group, or an aralkyl group, which may be the same or different from each other, and Z represents a group represented by formula (2):

[Formula 25]

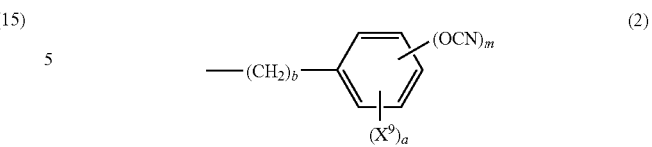
(2)

wherein $X^9$ represents a hydrogen atom, an alkyl group, a cycloalkyl group, an aryl group, or an aralkyl group, which may be the same or different from each other, and
a represents an integer of 1 to 4, b represents an integer of 0 to 4, and m represents an integer of 1 to 4, or
a group represented by formula (3):

[Formula 26]

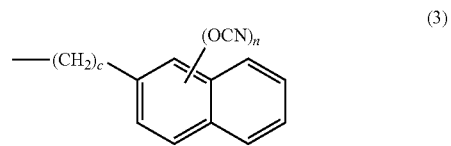
(3)

wherein c represents an integer of 0 to 4 and n represents an integer of 1 to 3. The phosphorus-containing cyanate ester compound (B) has a phosphorus atom and a cyanato group, thus making it possible to improve the flame retardancy and heat resistance of the resultant printed circuit board materials.

In the formula (1), $X^1$ to $X^8$ represent a hydrogen atom, an alkyl group, a cycloalkyl group, an aryl group or an aralkyl group, which may be the same or different from each other, and it is preferred that $X^1$ to $X^8$ are a hydrogen atom or a methyl group, which may be the same or different from each other. Specifically, examples of $X^1$ to $X^8$ include: a case in which all of the $X^1$ to $X^8$ are a hydrogen atom, a case in which $X^1, X^3, X^4, X^5$ and $X^7$ are a hydrogen atom and $X^2, X^6$ and $X^8$ are a methyl group, a case in which $X^1, X^2, X^3, X^4, X^5, X^7$ and $X^8$ are a hydrogen atom and $X^6$ is a tert-butyl group, a case in which $X^1, X^2, X^3, X^4, X^5, X^7$ and $X^8$ are a hydrogen atom and $X^6$ is an α,α-dimethylbenzyl group, a case in which $X^1, X^2, X^3, X^4, X^5, X^6$ and $X^7$ are a hydrogen atom and $X^8$ is a cyclohexyl group, and a case in which $X^1, X^2, X^3, X^4, X^5, X^6$ and $X^7$ are a hydrogen atom and $X^8$ is a phenyl group. Among them, the case in which all of the $X^1$ to $X^8$ are a hydrogen atom and the case in which $X^1, X^3, X^4, X^5$ and $X^7$ are a hydrogen atom and $X^2, X^6$ and $X^8$ are a methyl group are preferable, and the case in which all of the $X^1$ to $X^8$ are a hydrogen atom is particularly preferable.

In the formula (1), when Z represents a group represented by the formula (2), it is preferred that $X^9$ is a hydrogen atom, an alkyl group, or an aryl group, and a is 1 to 4, b is 0 to 2, and m is 1 to 2, and it is more preferred that a is 3, b is 0, and m is 2. Examples of the group represented by the formula (2) include: a 1-cyanatophenyl-3-yl group, a 1-cyanatophenyl-4-yl group, a 1,4-dicyanatophenyl-2-yl group, a 1,4-dicyanato-5-tert-butylphenyl-2-yl group, a 1,4-dicyanato-5-cyclohexyl phenyl-2-yl group, a 1,4-dicyanato-5-phenyl-phenyl-2-yl group, a 1,4,5-tricyanatophenyl-2-yl group, a 1,4,5,6-tetracyanatophenyl-2-yl group, a 3-cyanato-benzyl group, a 4-cyanato-benzyl group, a 4-cyanato-3,5-dimethyl benzyl group, and a 4-cyanato -3,5-di-tert-butyl benzyl group. Among them, a 1-cyanatophenyl-4-yl group, a 1,4-dicyanatophenyl-2-yl group, a 4-cyanato-benzyl group and a 4-cyanato-3,5-ditert-butyl benzyl group are preferable, and a 1,4-dicyanatophenyl-2-yl group is particularly preferable.

In the formula (1), when Z represents a group represented by the formula (3), it is preferred that c is 0 and n is 2. Examples of the group represented by the formula (3) include a 1-cyanatonaphthyl-2-yl group, a 4-cyanatonaphthyl-2-yl group, a 1,4-dicyanatonaphthyl-2-yl group, and a 1,3,4-tricyanatonaphthyl-2-yl group. Among them, a 4-cyanatonaphthy-2-yl group and a 1,4-dicyanatonaphthy-2-yl group are preferable, and a 1,4-dicyanatonaphthyl-2-yl group is particularly preferable.

The phosphorus-containing cyanate ester compound (B) used in the present invention is particularly preferably a compound represented by formula (11):

[Formula 27]

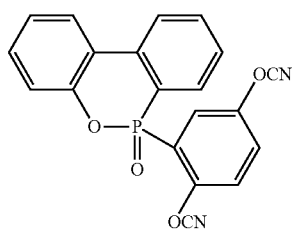

(11)

An example of a commercial item of this compound includes the trade name FR-300 from Lonza.

The phosphorus-containing cyanate ester compound (B) used in the present invention can be produced by conventionally public-known methods. For example, an intended cyanato-group-containing cyclic phosphinate compound can be obtained by reacting a cyclic phosphinate compound having a hydroxyl group represented by the formula (1) with a cyanogen halide to convert the —OH group moiety into an —OCN group. A method for converting the —OH group moiety into an —OCN group, that is, a method for producing a cyanate ester can be performed by conventionally publicly known methods such as a method in which a cyanogen halide is reacted with phenol in the presence of a tertiary amine, a method in which an alkali metal salt of an alcoholic or phenolic compound is reacted with a cyanogen halide.

The content of the phosphorus-containing cyanate ester compound (B) is preferably in the range of 10 to 25 parts by mass, more preferably in the range of 10 to 20 parts by mass, and particularly preferably in the range of 13 to 20 parts by mass with respect to 100 parts by mass of a total of (A) to (D) components from the viewpoint of heat resistance, flame retardancy, and electrical properties.

Non-Halogenated Epoxy Resin (C)

The non-halogenated epoxy resin (C) used in the present invention is not particularly limited, as far as it is a non-halogenated compound having two or more epoxy groups in one molecule. Specifically, examples thereof include a bisphenol A-based epoxy resin, a bisphenol F-based epoxy resin, a phenol novolac-based epoxy resin, a bisphenol A novolac-based epoxy resin, a biphenyl aralkyl-based epoxy resin, a cresol novolac-based epoxy resin, a multifunctional phenol-based epoxy resin, a naphthalene-based epoxy resin, a naphthalene skeleton-modified novolac-based epoxy resin, a phenol aralkyl-based epoxy resin, a biphenyl-based epoxy resin, an alicyclic epoxy resin, a polyol-based epoxy resin, a phosphorous-containing epoxy resin, a glycidyl amine, a glycidyl ester, a compound obtained by epoxidizing a double-bond of butadiene or the like, and a compound obtained by reaction of a hydroxyl group-containing silicone resin with epichlorohydrin. Among these non-halogenated epoxy resins, a naphthalene skeleton-modified novolac-based epoxy resin, a biphenyl aralkyl-based epoxy resin, or a cresol novolac-based epoxy resin is preferable in terms of heat resistance. These non-halogenated epoxy resins may be used singly or by mixing two or more kinds thereof as appropriate.

The content of the non-halogenated epoxy resin (C) is preferably in the range of 1 to 15 parts by mass, more preferably in the range of 3 to 12 parts by mass, and particularly preferably in the range of 5 to 10 parts by mass with respect to 100 parts by mass of a total of (A) to (D) components from the viewpoint of electrical properties, flame retardancy and peel strength.

Cyanate Ester Compound (D)

Examples of the cyanate ester compound (D) used in the present invention include a compound having two or more cyanato groups in a molecule, and a compound other than the compound represented by the formula (10) is not particularly limited. Specific examples include a bisphenol A-based cyanate ester resin and a prepolymer thereof, a naphthol aralkyl-based cyanate ester resin, 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis (4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris (4-cyanatophenyl)phosphite, tris(4-cyanatophenyl) phosphate and a cyanate ester compound obtained by reaction of novolac with a cyanogen halide. Among them, a bisphenol A-based cyanate ester resin and a prepolymer thereof, and a naphthol aralkyl-based cyanate ester resin are particularly preferable in terms of heat resistance. These cyanate ester compounds may be used singly or by mixing two or more kinds thereof as appropriate.

The content of the cyanate ester compound (D) is preferably in the range of 1 to 15 parts by mass, more preferably in the range of 3 to 12 parts by mass, and particularly preferably in the range of 5 to 10 parts by mass with respect to 100 parts by mass of a total of (A) to (D) components from the viewpoint of electrical properties and flame retardancy.

Filler (E)

As the filler (E) used in the present invention, those commonly used in a laminate use is applicable. Specific examples include inorganic fillers, such as silicas such as natural silica, molten silica, synthetic silica, amorphous silica, and hollow silica, molybdenum compounds such as molybdenum oxide and zinc molybdate, zinc borate, zinc stannate, alumina, clay, kaolin, talc, calcined clay, calcined kaolin, calcined talc, mica, short glass fibers (fine glass powders such as E glass and D glass), and hollow glass, and organic fillers, such as rubber powders such as styrene-type, butadiene-type, and acrylic-type rubber powders, core-shell-type rubber powder, silicone resin powder, silicone rubber powder, and silicone composite powder. Among them, in the present invention, silicas and talc are preferable, and silicas are particularly preferable from the viewpoint of electrical properties. These fillers may be used singly or in combination of two or more kinds thereof.

In the case of using a silica as the filler (E) of the present invention, an average particle size (D50) thereof is not particularly limited. However, given the dispersibility, preferred examples include mesoporous silica, spherical molten silica, spherical synthetic silica, and hollow spherical silica having an average particle size (D50) of 0.1 to 3 µm. If the average particle size (D50) is in the range of 0.1 to 3 µm, it is possible to improve problems such as flow characteristics at the time of molding, and breaking at the time of using a small-diameter drill bit. The average particle size (D50) was measured as follows. The particle size distribution of a predetermined amount of powder charged in a water dispersion medium was measured by a laser diffraction particle size distribution meter, the volume was added up in the order from the smallest particles, and the particle size when 50% of the total volume were obtained was used as an average particle size (D50).

The content of the filler (E) is preferably in the range of 10 to 200 parts by mass, particularly preferably in the range of 20 to 150 parts by mass, and particularly preferably in the range of 40 to 100 parts by mass with respect to 100 parts by mass of a resin solids content in the resin composition from the viewpoint of flame retardancy, peel strength, moldability, heat resistance and electrical properties.

Other Components

The resin composition according to the present invention may further comprise a silane coupling agent. As the filler (E), it is preferable to use a silane coupling agent and a wetting dispersant in combination. These silane coupling agents are not particularly limited, as far as they are commonly used in the surface treatment of an inorganic substance. Specific examples include aminosilanes such as γ-aminopropyltriethoxysilane and N-β-aminoethyl)-γ-aminopropyltrimethoxylan, epoxy silanes such as γ-glycidoxypropyltrimethoxysilane and β-(3,4-epoxycyclohexyl) ethyltrimethoxysilane, vinylsilanes such as γ-methaacryloxypropyltrimethoxysilane and vinyl-tri(β-methoxyethoxy)silane, cationic silanes such as N-β-(N-vinylbenzylaminoethyl)-γ-aminopropyltrimethoxysilane hydrochloride, and phenyl silanes, and they may be used singly or in combination of two or more kinds thereof as appropriate. Further, the wetting dispersant is not particularly limited, as far as it is a dispersion stabilizer used in coating. Preferably, a copolymer-based wetting dispersant having an acid group is used, and specific examples thereof include Disperbyk-110, 111, 161, 996, and W903 from BYK-Chemie Japan.

The resin composition according to the present invention may further comprise a hardening accelerator in order to appropriately adjust a curing rate as necessary. These hardening accelerators are not particularly limited, as far as they are publicly known and commonly used as a hardening accelerator for a cyanate ester resin and an epoxy resin. Specific examples thereof include organic salts of metals such as copper, zinc, cobalt and nickel, imidazoles and derivatives thereof, and tertiary amines.

The resin composition according to the present invention may further comprise various polymer compounds such as other thermosetting resins, thermoplastic resins and oligomers thereof, and elastomers, other flame retardant compounds, additives, or the like to the extent at which desired properties are not impaired. These are not particularly limited, as far as they are commonly used. For example, the flame retardant compounds include phosphate esters, melamine phosphates, phosphorus-containing epoxy resins, nitrogen-containing compounds such as melamine and benzoguanamine, oxazine ring-containing compounds, silicon-based compounds, or the like. As the additives, an ultraviolet absorber, an antioxidant, a photo-polymerization initiator, an optical whitening agent, a photo-sensitizer, a dye, a pigment, a thickener, a lubricant, a defoamer, a dispersant, a leveling agent, and a polish may be appropriately used in combination thereof as desired.

The resin composition according to the present invention can be used as a solution of a resin composition dissolved in an organic solvent as necessary. The organic solvent is not particularly limited, as far as it dissolves a mixture of various components in the present invention. Specific examples include ketones such as acetone, methyl ethyl ketone, and methyl isobutyl ketone, polar solvents such as dimethylacetamide and dimethylformamide, and aromatic hydrocarbon solvents such as toluene and xylene and they are used singly or by mixing two or more kinds thereof.

Prepreg

The prepreg according to the present invention is formed by impregnating a base material with the above resin composition or applying the resin composition to the base material. A method for producing the prepreg according to the present invention is not particularly limited, as far as a prepreg is produced by combining the above resin composition and the base material. Specifically, a method in which the resin composition of the present invention is semi-cured by being impregnated or applied in or to the base material, and being dried at 120 to 220° C. for approximately 2 to 15 minutes to produce the prepreg. The content of the resin composition to the base material is preferably in the range of 30 to 90% by mass in terms of the ratio of the resin composition to the total amount of the prepreg.

As the base material used at the time of producing the prepreg in the present invention, publicly known base materials used for various printed circuit board materials can be used. For example, woven fabrics such as E glass, D glass, S glass, T glass, NE glass, quartz, and a liquid crystal polyester are included. The thickness of the woven fabrics is not particularly limited. However, a woven fabric having a thickness of 0.01 to 0.2 mm, which is used for the purpose of a laminate, and to which a super opening treatment or a clogging treatment is particularly applied is particularly preferable in terms of dimensional stability. Further, a glass woven fabric, the surface of which is treated with a silane coupling agent or the like used in an epoxy silane treatment, an amino silane treatment, or the like is preferable in terms of heat resistance in moisture absorption. Furthermore, the liquid crystal polyester woven fabric is preferable in terms of electrical properties.

Metal Foil-Clad Laminate

The metal foil-clad laminate according to the present invention is lamination-molded using the above-described prepreg. Specifically, on one surface or both surfaces of one prepreg or a plurality of prepregs stacked together, a metal foil is disposed, and the resultant is lamination-molded, for example, at a temperature of 180 to 220° C. for a heating time of 100 to 300 minutes at a surface pressure of 20 to 40 kg/cm$^2$, thereby producing the laminate. The thickness of a metal foil to be used is not particularly limited, as far as it is used in printed circuit board materials, but the thickness is preferably 3 to 35 μm. An electrolytic copper foil having a small surface roughness for a matte surface is preferable in consideration of a conductor loss in a high-frequency region. Further, as a method for producing a multi-layer board, for example, a copper foil of 35 μm is arranged on both surfaces of one prepreg of the present invention and lamination-formed under the above conditions, and an internal layer circuit is then formed, and a blackening treatment is applied to the circuit to obtain an internal layer circuit board. The internal layer circuit board and the prepreg of the present invention can be lamination-molded in combination thereof to obtain a multi-layer board.

Resin Sheet

The resin sheet according to the present invention can be obtained by applying a solution of the above resin composition to a sheet base material, and drying the coating, then peeling or etching the base material. The sheet base material includes an organic film base material such as a polyethylene film, a polypropylene film, a polycarbonate film, a polyethylene terephthalate film, an ethylene-tetrafluoroethylene copolymer film, and a releasing film in which a releasing agent is applied onto the surfaces of these films, a polyimide film, a conductive foil such as a copper foil and an aluminum foil, a plate-shaped base material such as a glass plate, a SUS plate and an FRP. A coating method includes, for example, a method by which a solution of the resin composition is applied onto the sheet base material with a bar coater, a die coater, a doctor blade, a baker applicator, or the like, and the solvent is dried.

There is no particular limitation on the drying condition at the time of drying a solvent, but the solvent is preferably dried at a temperature of 20° C. to 170° C. for 1 to 90 minutes. This is because if a drying temperature is 20° C. or higher, a solvent is not susceptible to remaining in a resin composition, and if the drying temperature is 170° C. or lower, curing of the resin composition is not in progress. The thickness of a resin layer can be adjusted by the concentration and coating thickness of a solution of the resin composition. The thickness of a resin layer is preferably 0.1 to 500 μm from the viewpoint of easy evaporation of the solvent at the time of drying.

The resin composition according to the present invention can be used as an insulating layer of a printed circuit board and a semiconductor package material. For example, a copper foil with a resin is obtained by applying a solution in which the curable resin composition of the present invention is dissolved in a solvent and drying the applied solution using a copper foil as a base material, or a build-up film, a dry film solder mask, and a die attach film are obtained by applying a solution in which the curable resin composition of the present invention is dissolved in a solvent and drying the applied solution using a plastic film which can be peeled off as a base material. The solvent can be dried by being heated at a temperature of 20° C. to 150° C. for 1 to 90 minutes. Further, the curable resin composition can be used in an uncured state in which the solvent is just dried, or can be used in a semi-cured state (B-staging) as necessary.

EXAMPLES

Hereinafter, the present invention will be specifically described using Synthesis Examples, Examples, and Comparative Examples. However, the present invention is not limited thereto.

Synthesis Example 1

Synthesis of α-Naphthol Aralkyl-Based Cyanate Ester Resin

A reactor equipped with a thermometer, a stirrer, a dropping funnel and a reflux condenser was previously cooled to 0 to 5° C. using brine. 7.47 g (0.122 mol) of cyanogen chloride, 9.75 g (0.0935 mol) of 35% hydrochloric acid, 76 ml of water, and 44 ml of methylene chloride were into the reactor.

20 g (0.0935 mol) of an α-naphthol aralkyl (SN 485, OH group equivalent: 214 g/eg. softening point: 86° C., manufactured by Nippon Steel Chemical Co., Ltd.) and 14.16 g (0.14 mol) of triethylamine dissolved in 92 ml of methylene chloride was added dropwise to the contents in the reactor through a dropping funnel over 1 hr under stirring while maintaining the temperature within the reactor at −5 to +5 and maintaining the pH at 1 or low, and after the completion of the dropwise addition, 4.72 g (0.047 mol) of triethylamine was further added dropwise thereto over 15 minutes.

After the completion of the dropwise addition, the mixture was stirred at the same temperature for 15 minutes, the reaction solution was then separated to obtain an organic layer. The organic layer obtained was washed with 100 ml of water twice, methylene chloride was then distilled off by an evaporator under reduced pressure, and the residue was finally concentrated to dryness at 80° C. for an hour to obtain 23.5 g of the intended cyanate ester resin represented by the formula (17):

[Formula 28]

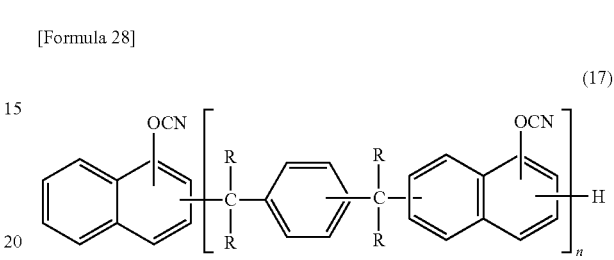

(17)

(wherein R represents a hydrogen atom or a methyl group, and n represents an integer of 1 to 50.)

When the cyanate ester obtained was analyzed by the liquid chromatography and IR spectrum, no peak of the raw materials was detected. Further, the structure was identified by $^{13}$C-NMR and 1H-NMR. The conversion rate from an OH group to a cyanato group was 99% or more.

Example 1

70 parts by mass of polyphenylene ether (A) (OPE-2St 1200, manufactured by Mitsubishi Gas Chemical Company Inc., number average molecular weight 1187, vinyl group equivalent: 590 g/eq.) represented by general formula (7), wherein —(O—X—O)— is represented by formula (12), —(Y—O)— is represented by formula (15), and a and b are 0 to 100, 15 parts by mass of a phosphorus-containing cyanate ester resin (FR-300, manufactured by Lonza Group Ltd., cyanate equivalent: 187 g/eq.), 7 parts by mass of a naphthalene-skeleton-modified novolac-based epoxy resin (EXA-9900, manufactured by DIC Corporation, epoxy equivalent: 250 g/eq.), 8 parts by mass of an α-naphthol aralkyl-based cyanate ester resin obtained by Synthesis Example 1, and 70 parts by mass of spherical silica (SC2050, manufactured by Admatechs Co., Ltd., average particle size 0.5 μm) were blended, and a solid content thereof was diluted with methyl ethyl ketone into 65% by mass to obtain varnish. The varnish obtained was impregnated in E glass cloth (IPC No. #3313) having a thickness of 0.08 mm and coated, and was heat-dried using a drier (explosion-proof steam drier, manufactured by KK. Takasugi-Seisakusho) at 170° C. for 8 minutes to obtain a prepreg having 55% by mass of a resin composition. A 18 μm-copper foil (3EC-III, manufactured by Mitsui Mining and Smelting Company, Limited) was disposed on both surfaces on a stack of 8 sheets of the prepregs having 55% by mass of a resin composition, and vacuum press was performed at a temperature of 210° C. under pressure of 30 kg/cm² for 150 minutes to obtain a 18 μm-copper-clad laminate having a thickness of 0.8 mm. The flame retardancy, heat resistance, thermal expansion rate, electrical properties, and peel strength were evaluated using the copper-clad laminate obtained. The results are shown in Table 1.

(Measurement Method)
1) Flame resistance: measured in accordance with the UL 94 Vertical Test Method (n=5).
2) Glass Transition Temperature (Tg): measured by the DMA method, and in the average value of two measurements, a temperature of 200° C. or higher was expressed as (○) and a temperature of less than 200° C. was expressed as (X).
3) Thermal Expansion Coefficient ($\alpha 1$, $\alpha 2$): measured by the TMA method provided in JIS C 6481, and in the average value of two measurements, a case in which $\alpha 1$ was 50 ppm/° C. or lower and $\alpha 2$ was 250 ppm/° C. or lower was expressed as (○), and a case in which either thereof was in the excess of the values was expressed as ($\Delta$) and a case in which both were in the excess of any of the values was expressed as (x).
4) Dielectric Loss Tangent: a test piece from which a copper foil of a copper-clad laminate having a thickness of 0.8 mm was removed was used, and measurements of a Dielectric Loss Tangent of 10 GHz were performed by the Cavity Perturbation Method (Agilent 8722 ES, manufactured by Agilent Technologies) five times: a case in which a measurement was 0.005 or less at least four times was expressed as (○); a case in which a measurement was 0.005 or less two to three times was expressed as ($\Delta$); and a case in which a measurement was over 0.005 at least four times was expressed as (x).
5) Peel Strength: a test piece (30 mm×150 mm×0.8 mm) with a 18 μm copper foil was used, and the peel strength of the copper foil was measured two times in accordance with the JIS C6481: a case in which both measurements were 0.7 kg/cm or more was expressed as (○), a case in which only one measurement was 0.7 kg/cm or more was expressed as ($\Delta$), and a case in which both measurements were less than 0.7 kg/cm was expressed as (x).

Example 2

Example 2 was performed in a manner similar to Example 1 except that 60 parts by mass of the polyphenylene ether (A) (OPE-2St 1200), 20 parts by mass of the phosphorus-containing cyanate ester resin (FR-300), and 10 parts by mass of the naphthalene-skeleton-modified novolac-based epoxy resin (EXA-9900), which were used in Example 1, and 10 parts by mass of a bisphenol A-based cyanate ester resin (CA210) in place of 8 parts by mass of the α-naphthol aralkyl-based cyanate ester resin were used. The values of properties of the copper-clad laminate obtained are shown in Table 1.

Example 3

Example 3 was performed in a manner similar to Example 1 except that 80 parts by mass of the polyphenylene ether (A) (OPE-2St 1200), 10 parts by mass of the phosphorus-containing cyanate ester resin (FR-300), 5 parts by mass of naphthalene-skeleton-modified novolac-based epoxy resin (EXA-9900), and 5 parts by mass of an α-naphthol aralkyl-based cyanate ester resin, which were used in Example 1, were used. The values of properties of the copper-clad laminate obtained are shown in Table 1.

Example 4

Example 4 was performed in a manner similar to Example 1 except that 40 parts by mass of the spherical silica (SC 2050) was used. The values of properties of the copper-clad laminate obtained are shown in Table 1.

Example 5

Example 5 was performed in a manner similar to Example 1 except that 8 parts by mass of the bisphenol A-based cyanate ester resin (CA 210, manufactured by Mitsubishi Gas Chemical Company Inc., cyanate equivalent: 139 g/eq.) in place of 8 parts by mass of the α-naphthol aralkyl-based cyanate ester resin, and 100 parts by mass of the spherical silica (SC 2050) were used. The values of properties of the copper-clad laminate obtained are shown in Table 1.

Example 6

Example 6 was performed in a manner similar to Example 1 except that 10 parts by mass of the naphthalene-skeleton-modified novolac-based epoxy resin (EXA-9900) and 5 parts by mass of the α-naphthol aralkyl-based cyanate ester resin were used. The values of properties of the copper-clad laminate obtained are shown in Table 1.

Example 7

Example 7 was performed in a manner similar to Example 1 except that 5 parts by mass of the naphthalene skeleton-modified novolac-based epoxy resin (EXA-9900), and 10 parts by mass of the bisphenol A-based cyanate ester resin (CA 210) in place of 8 parts by mass of the α-naphthol aralkyl-based cyanate ester resin were used. The values of properties of the copper-clad laminate obtained are shown in Table 1.

Example 8

Example 8 was performed in a manner similar to Example 1 except that 55 parts by mass of the polyphenylene ether (A) (OPE-2St 1200), 22 parts by mass of the phosphorus-containing cyanate ester resin (FR-300), 11 parts by mass of the naphthalene-skeleton-modified novolac-based epoxy resin (EXA-9900), and 12 parts by mass of the α-naphthyl aralkyl-based cyanate ester resin, which were used in Example 1, were used. The values of properties of the copper-clad laminate obtained are shown in Table 1.

Example 9

Example 9 was performed in a manner similar to Example 1 except that 80 parts by mass of the polyphenylene ether (A) (OPE-2St 1200), 2 parts by mass of the naphthalene-skeleton-modified novolac-based epoxy resin (EXA-9900), and 3 parts by mass of the bisphenol A-based cyanate ester resin (CA 210) in place of 8 parts by mass of the α-naphthol aralkyl-based cyanate ester resin, which were used in Example 1, were used. The values of properties of the copper-clad laminate obtained are shown in Table 1.

Example 10

Example 10 was performed in a manner similar to Example 1 except that 8 parts by mass of the naphthalene-skeleton-modified novolac-based epoxy resin (EXA-9900), 7 parts by mass of the bisphenol A-based cyanate ester resin (CA 210) in place of 8 parts by mass of the α-naphthol aralkyl-based cyanate ester resin, and 20 parts by mass of the spherical silica (SC 2050) were used. The values of properties of the copper-clad laminate obtained are shown in Table 1.

Example 11

Example 11 was performed in a manner similar to Example 1 except that 8 parts by mass of the naphthalene-skeleton-modified novolac-based epoxy resin (EXA-9900), 7 parts by mass of the α-naphthol aralkyl-based cyanate ester resin, and 150 parts by mass of the spherical silica (SC 2050) were used. The values of properties of the copper-clad laminate obtained are shown in Table 1.

Example 12

Example 12 was performed in a manner similar to Example 1 except that 70 parts by mass of the polyphenylene ether (A) (OPE-2St 2200, manufactured by Mitsubishi Gas Chemical Company Inc., number average molecular weight 2250, vinyl group equivalent: 1189 g/eq.) represented by the general formula (7), wherein —(O—X—O)— is represented by the formula (12), —(Y—O)— is represented by the formula (15), and a and b are 0 to 100 were used. The values of properties of the copper-clad laminate obtained are shown in Table 1.

Comparative Example 1

15 parts by mass of the phosphorus-containing cyanate ester resin (FR-300), 40 parts by mass of the naphthalene-skeleton-modified novolac-based epoxy resin (EXA-9900), 45 parts by mass of the α-naphthol aralkyl-based cyanate ester resin, and 70 parts by mass of the spherical silica (SC 2050) were blended and diluted with methyl ethyl ketone into a solid content of 65% to obtain varnish. Comparative Example 1 was performed in a manner similar to Example 1 except for using the varnish to obtain a copper-clad laminate. The values of properties of the copper-clad laminate obtained are shown in Table 2.

Comparative Example 2

70 parts by mass of the polyphenylene ether (A) (OPE-2St 1200), 15 parts by mass of the phosphorus-containing cyanate ester resin (FR-300), 15 parts by mass of the naphthalene-skeleton-modified novolac-based epoxy resin (EXA-9900), and 70 parts by mass of the spherical silica (SC 2050), which were used in Example 1, were blended, and diluted with methyl ethyl ketone into a solid content of 65% to obtain varnish. Comparative Example 2 was performed in a manner similar to Example 1 except for using the varnish, and the values of properties of the copper-clad laminate obtained are shown in Table 2.

Comparative Example 3

70 parts by mass of the polyphenylene ether (A) (OPE-2St 1200), 15 parts by mass of the phosphorus-containing cyanate ester resin (FR-300), 15 parts by mass of the α-naphthol aralkyl-based cyanate ester resin, and 70 parts by mass of the spherical silica (SC 2050), which were used in Example 1, were blended, and diluted with methyl ethyl ketone into a solid content of 65% to obtain varnish. Comparative Example 3 was performed in a manner similar to Example 1 except for using the varnish, and the values of properties of the copper-clad laminate obtained are shown in Table 2.

Comparative Example 4

70 parts by mass of the polyphenylene ether (A) (OPE-2St 1200), 14 parts by mass of the naphthalene-skeleton-modified novolac-based epoxy resin (EXA-9900), 16 parts by mass of the bisphenol A-based cyanate ester resin (CA 210), and 70 parts by mass of the spherical silica (SC 2050), which were used in Example 1, were blended, and diluted with methyl ethyl ketone into a solid content of 65% to obtain varnish. Comparative Example 4 was performed in a manner similar to Example 1 except for using the varnish, and the values of properties of the copper-clad laminate obtained are shown in Table 2.

Comparative Example 5

70 parts by mass of the polyphenylene ether (A) (OPE-2St 1200), 15 parts by mass of the phosphorus-containing cyanate ester resin (FR-300), 7 parts by mass of the naphthalene-skeleton-modified novolac-based epoxy resin (EXA-9900), and 8 parts by mass of the bisphenol A-based cyanate ester resin (CA 210), which were used in Example 1, were blended, and diluted with methyl ethyl ketone into a solid content of 65% to obtain varnish. Comparative Example 5 was performed in a manner similar to Example 1 except for using the varnish, and the values of properties of the copper-clad laminate obtained are shown in Table 2.

Comparative Example 6

Comparative Example 6 was performed in a manner similar to Example 1 except for using a cyanophenylphosphazene compound (FP-300, manufactured by FUSHIMI Pharmaceutical Co., Ltd.) in place of the phosphorus-containing cyanate ester resin (FR-300). The values of properties of the copper-clad laminate obtained are shown in Table 2.

Comparative Example 7

Comparative Example 7 was performed in a manner similar to Example 1 except for using a phosphorylphenanthrene compound (HCA, manufactured by SANKO Company, Limited) in place of the phosphorus-containing cyanate ester resin (FR-300). The values of properties of the copper-clad laminate obtained are shown in Table 2.

TABLE 1

| Evaluation item | Spec | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|
| Flame resistance | V-0 | V-0 | V-0 | V-0 | V-0 | V-0 | V-0 | V-0 | V-0 | V-0 | V-0 | V-0 | V-0 |
| Glass transition temperature | 200° C. or higher | ◯ | ◯ | ◯ | ◯ | ◯ | ◯ | ◯ | ◯ | ◯ | ◯ | ◯ | ◯ |

TABLE 1-continued

| Evaluation item | Spec | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|---|
| Thermal expansion coefficient | α1: 50 ppm/° C. or lower  α2: 250 ppm/° C. or lower | ○ | ○ | ○ | ○ | ○ | ○ | ○ | ○ | ○ | Δ | ○ | ○ |
| Dielectric loss tangent | 0.005 or less | ○ | ○ | ○ | ○ | ○ | ○ | ○ | Δ | ○ | ○ | ○ | ○ |
| Peel strength | 0.7 kg/cm or more | ○ | ○ | ○ | ○ | ○ | ○ | ○ | ○ | Δ | ○ | Δ | ○ |

TABLE 2

| Evaluation item | Spec | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Flame resistance | V-0 | V-0 | V-0 | V-0 | V-0 | V-1 | V-1 | V-0 | V-0 |
| Glass transition temperature | 200° C. or higher | ○ | ○ | ○ | ○ | ○ | X | X | |
| Thermal expansion coefficient | α1: 50 ppm/° C. or lower  α2: 250 ppm/° C. or lower | ○ | ○ | ○ | ○ | X | X | X |
| Dielectric loss tangent | 0.005 or less | X | X | ○ | ○ | X | X | X |
| Peel strength | 0.7 kg/cm or more | ○ | ○ | X | ○ | ○ | ○ | X |

The invention claimed is:

1. A resin composition comprising:

a polyphenylene ether (A);

a phosphorous-containing cyanate ester compound (B) represented by general formula (1):

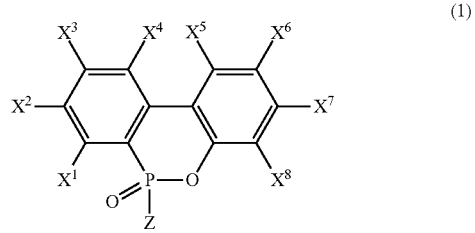

(1)

wherein $X^1$ to $X^8$ represent a hydrogen atom, an alkyl group, a cycloalkyl group, an aryl group, or an aralkyl group, which may be the same or different from each other, and Z represents a group represented by general formula (2):

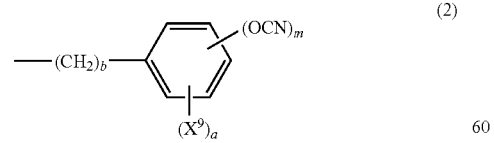

(2)

wherein $X^9$ represents a hydrogen atom, an alkyl group, a cycloalkyl group, an aryl group, or an aralkyl group, which may be the same or different from each other, and a represents an integer of 1 to 4, b represents an integer of 0 to 4, and m represents an integer of 1 to 4, or a group represented by general formula (3):

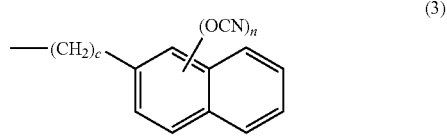

(3)

wherein c represents an integer of 0 to 4, and n represents an integer of 1 to 3;

a non-halogenated epoxy resin (C);

a cyanate ester compound (D) other than the compound represented by the formula (1); and a filler (E), wherein a content of the filler (E) is 10 to 200 parts by mass with respect to 100 parts by mass of a total of the (A) to (D) components, and wherein a content of the polyphenylene ether (A) is 50 to 90 parts by mass with respect to 100 parts by mass of a total of the (A) to (D) components.

2. The resin composition according to claim 1, wherein the polyphenylene ether (A) is a polymer comprising at least a repeating unit represented by general formula (4):

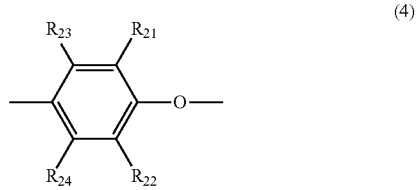

(4)

wherein $R_{21}$, $R_{22}$, $R_{23}$, and $R_{24}$ may be the same or different from each other, and represent an alkyl group having 6 or less carbon atoms, an aryl group, halogen, or hydrogen.

3. The resin composition according to claim 2, wherein the polymer further comprises a repeating unit represented by general formula (5):

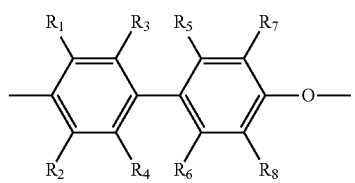

(5)

wherein $R_1$, $R_2$, $R_3$, $R_7$, and $R_8$ may be the same or different from each other, and are an alkyl group having 6 or less carbon atoms or a phenyl group, and $R_4$, $R_5$, and $R_6$ may be the same or different from each other, and are a hydrogen atom, an alkyl group having 6 or less carbon atoms or a phenyl group, and/or a repeating unit represented by general formula (6):

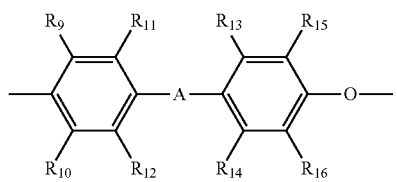

(6)

wherein $R_9$, $R_{10}$, $R_{11}$, $R_{12}$, $R_{13}$, $R_{14}$, $R_{15}$, and $R_{16}$ may be the same or different from each other, and are a hydrogen atom, an alkyl group having 6 or less carbon atoms or a phenyl group, and -A- is a linear, branched, or cyclic divalent hydrocarbon group having 20 or less carbon atoms.

4. The resin composition according to claim 1, wherein the polyphenylene ether (A) comprises a modified polyphenylene ether having an ethylenically unsaturated group at both ends.

5. The resin composition according to claim 4, wherein the ethylenically unsaturated group is at least one selected from the group consisting of an alkenyl group, a cycloalkenyl group, and an alkenyl aryl group.

6. The resin composition according to claim 1, wherein the polyphenylene ether (A) comprises a modified polyphenylene ether represented by general formula (7):

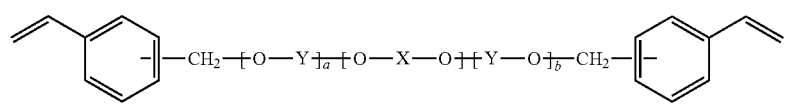

(7)

wherein —(O—X—O)— comprises a structure represented by general formula (8):

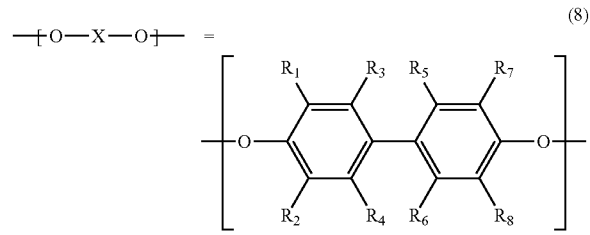

(8)

wherein $R_1$, $R_2$, $R_3$, $R_7$, and $R_8$ may be the same or different from each other, and are an alkyl group having 6 or less carbon atoms or a phenyl group, and $R_4$, $R_5$, and $R_6$ may be the same or different from each other, and are a hydrogen atom, an alkyl group having 6 or less carbon atoms or a phenyl group, or general formula (9):

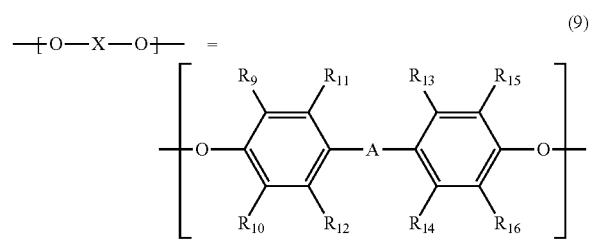

(9)

wherein $R_9$, $R_{10}$, $R_{11}$, $R_{12}$, $R_{13}$, $R_{14}$, $R_{15}$, and $R_{16}$ may be the same or different from each other, and are a hydrogen atom, an alkyl group having 6 or less carbon atoms or a phenyl group, and -A- is a linear, branched, or cyclic divalent hydrocarbon group having 20 or less carbon atoms, and —(Y—O)— is represented by general formula (10):

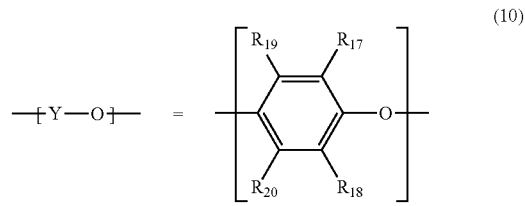

(10)

wherein $R_{17}$ and $R_{18}$ may be the same or different from each other, and are an alkyl group having 6 or less carbon atoms or a phenyl group, and $R_{19}$ and $R_{20}$ may be the same or different from each other, and are a hydrogen atom, an alkyl group having 6 or less carbon atoms or a phenyl group, and a sequence of the —(Y—O)— units comprises one —(Y—O)— unit or two or more different —(Y—O)— units arranged randomly, and a and b represent an integer of 0 to 100, with at least either of a and b being not 0.

7. The resin composition according to claim 1, wherein a number average molecular weight of the polyphenylene ether (A) is 500 to 3000.

8. The resin composition according to claim 1, wherein the phosphorus-containing cyanate ester compound (B) is a compound wherein, in formula (1), $X^1$ to $X^8$ are a hydrogen atom or a methyl group, which may be the same or different from each other, Z represents a group represented by formula (2), $X^9$ is a hydrogen atom, an alkyl group, or an aryl group, a is 1 to 4, b is 0 to 2, and m is 1 to 2.

9. The resin composition according to claim 1, wherein the phosphorus-containing cyanate ester compound (B) is a compound represented by formula (11):

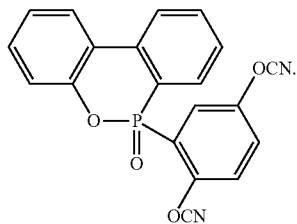

(11)

10. The resin composition according to claim 1, wherein a content of the phosphorus-containing cyanate ester compound (B) is 10 to 25 parts by mass with respect to 100 parts by mass of a total of the (A) to (D) components.

11. The resin composition according to claim 1, wherein the non-halogenated epoxy resin (C) is at least one selected from the group consisting of a naphthalene modified epoxy resin, a biphenyl aralkyl-based epoxy resin, and a cresol novolac-based epoxy resin.

12. The resin composition according to claim 1, wherein a content of the non-halogenated epoxy resin (C) is 1 to 15 parts by mass with respect to 100 parts by mass of a total of the (A) to (D) components.

13. The resin composition according to claim 1, wherein the cyanate ester compound (D) is a bisphenol A-based cyanate ester resin or a naphthol aralkyl-based cyanate ester resin.

14. The resin composition according to claim 1, wherein a content of the cyanate ester compound (D) is 1 to 15 parts by mass with respect to 100 parts by mass of a total of the (A) to (D) components.

15. A prepreg obtained by impregnating or coating a base material with the resin composition according to claim 1.

16. A metal foil-clad laminate obtained by stacking at least one prepreg according to claim 15, disposing a metal foil on one surface or both surfaces of the prepreg or the stacked prepregs, and lamination-molding the metal foil and the prepreg or the stacked prepregs.

17. A resin sheet obtained by coating the surface of a metal foil or a film with a solution of the resin composition according to claim 1, and drying the solution.

* * * * *